US010971451B2

United States Patent
Byun et al.

(10) Patent No.: US 10,971,451 B2
(45) Date of Patent: Apr. 6, 2021

(54) INTERCONNECT STRUCTURE HAVING NANOCRYSTALLINE GRAPHENE CAP LAYER AND ELECTRONIC DEVICE INCLUDING THE INTERCONNECT STRUCTURE

(71) Applicant: Samsung Electronics Co., Ltd., Suwon-si (KR)

(72) Inventors: Kyung-Eun Byun, Seongnam-si (KR); Keunwook Shin, Yongin-si (KR); Yonghoon Kim, Seoul (KR); Hyeonjin Shin, Suwon-si (KR); Hyunjae Song, Hwaseong-si (KR); Changseok Lee, Seoul (KR); Changhyun Kim, Seoul (KR); Yeonchoo Cho, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/215,899

(22) Filed: Dec. 11, 2018

(65) Prior Publication Data
US 2020/0035611 A1 Jan. 30, 2020

(30) Foreign Application Priority Data

Jul. 24, 2018 (KR) .................. 10-2018-0086013

(51) Int. Cl.
*H01L 23/532* (2006.01)
*H01L 21/768* (2006.01)
*H01L 23/522* (2006.01)

(52) U.S. Cl.
CPC .. *H01L 23/53276* (2013.01); *H01L 21/76802* (2013.01); *H01L 21/76846* (2013.01);
(Continued)

(58) Field of Classification Search
CPC combination set(s) only.
See application file for complete search history.

(56) References Cited

U.S. PATENT DOCUMENTS 8,476,765 B2 7/2013 Zhang et al.
9,306,005 B2 4/2016 Byun et al.
(Continued)

FOREIGN PATENT DOCUMENTS

CN 103121670 A 5/2013
CN 103572247 A 2/2014
(Continued)

OTHER PUBLICATIONS

European Search Report dated Mar. 29, 2019, issued in corresponding European Patent Application No. 18206535.9.
(Continued)

*Primary Examiner* — Nduka E Ojeh
(74) *Attorney, Agent, or Firm* — Harness, Dickey & Pierce, P.L.C.

(57) ABSTRACT

Provided are an interconnect structure and an electronic device including the interconnect structure. The interconnect structure includes a dielectric layer including at least one trench, a conductive wiring filling an inside of the at least one trench, and a cap layer on at least one surface of the conductive wiring. The cap layer includes nanocrystalline graphene. The nanocrystalline includes nano-sized crystals.

22 Claims, 7 Drawing Sheets

(52) U.S. Cl.
CPC .. *H01L 21/76849* (2013.01); *H01L 21/76877* (2013.01); *H01L 23/5226* (2013.01)

(56) References Cited

U.S. PATENT DOCUMENTS

| | | | |
|---|---|---|---|
| 9,371,234 | B2 | 6/2016 | Hong et al. |
| 9,472,450 | B2 | 10/2016 | Bonilla et al. |
| 9,499,408 | B2 | 11/2016 | Rieken |
| 9,543,156 | B1 | 1/2017 | Hu |
| 2007/0082488 | A1 | 4/2007 | Katou |
| 2011/0117328 | A1* | 5/2011 | Ivanov ............... H01L 21/76877 428/172 |
| 2012/0138903 | A1 | 6/2012 | Chung et al. |
| 2012/0139114 | A1* | 6/2012 | Zhang ............... H01L 21/76849 257/751 |
| 2012/0147147 | A1 | 6/2012 | Park et al. |
| 2012/0261644 | A1 | 10/2012 | Dimitrakopoulos |
| 2013/0001515 | A1 | 1/2013 | Li et al. |
| 2013/0187097 | A1 | 7/2013 | Hong et al. |
| 2013/0299988 | A1* | 11/2013 | Bonilla ............... H01L 23/53238 257/751 |
| 2013/0321584 | A1 | 12/2013 | Choi |
| 2014/0145332 | A1* | 5/2014 | Ryan ................ H01L 21/76843 257/751 |
| 2014/0353722 | A1 | 12/2014 | Zhang et al. |
| 2015/0235959 | A1 | 8/2015 | Lee et al. |
| 2016/0240482 | A1* | 8/2016 | Song ................ H01L 23/53209 |
| 2016/0270237 | A1* | 9/2016 | Cho ................ H01L 23/53238 |
| 2016/0339160 | A1 | 11/2016 | Bedworth et al. |
| 2017/0033003 | A1 | 2/2017 | Song et al. |
| 2017/0154701 | A1 | 6/2017 | Lee et al. |
| 2018/0057933 | A1 | 3/2018 | Ifuku et al. |
| 2018/0149966 | A1 | 5/2018 | Shin et al. |
| 2018/0187298 | A1 | 7/2018 | Matsumoto |
| 2019/0108948 | A1* | 4/2019 | Chai ................ H01M 4/485 |
| 2019/0161351 | A1 | 5/2019 | Song et al. |
| 2019/0285548 | A1 | 9/2019 | Nunney et al. |
| 2020/0039827 | A1 | 2/2020 | Jung et al. |
| 2020/0071233 | A1* | 3/2020 | Joo ................ C04B 35/62272 |
| 2020/0105524 | A1 | 4/2020 | Shin et al. |
| 2020/0140279 | A1 | 5/2020 | Shin et al. |

FOREIGN PATENT DOCUMENTS

| | | |
|---|---|---|
| CN | 105585011 A | 5/2016 |
| JP | 2013249530 A | 12/2013 |
| JP | 2014-170826 A | 9/2014 |
| KR | 20120059853 A | 6/2012 |
| KR | 101312454 B1 | 9/2013 |
| KR | 101313746 B1 | 10/2013 |
| KR | 2014-0005470 A | 1/2014 |
| KR | 101381008 B1 | 4/2014 |
| KR | 2014-0090333 A | 7/2014 |
| KR | 10-20105-0012251 A | 2/2015 |
| KR | 101493893 B1 | 2/2015 |
| KR | 103121670 B | 4/2015 |
| KR | 2015-0082197 A | 7/2015 |
| KR | 10-2015-0098180 A | 8/2015 |
| KR | 2015-0116570 A | 10/2015 |
| KR | 20150121680 A | 10/2015 |
| KR | 2016-0059468 A | 5/2016 |
| KR | 20160085418 A | 7/2016 |
| KR | 10-2016-0112245 A | 9/2016 |
| KR | 20180025819 A | 3/2018 |
| WO | WO-2015022500 A1 | 2/2015 |
| WO | WO-2015149116 A1 | 10/2015 |

OTHER PUBLICATIONS

Wang et al., "Synthesis of graphene on a popycrystalline Co film by radio-frequency plasma-enhanced chemical vapour deposition", J.Phys. D:Appl.Phys. 43 (2010) 455402.

Liu et al., "Two-step growth of graphene with seperate controlling nucleation and edge growth directly on $SiO_2$ Substrates" arbon 72 (2014) pp. 387-392.

Kim et al., "Direct growth of patterned graphene on $SiO_2$ Substrates without the use of catalysis or lithography" Nanoscale (2014) 6, pp. 10100-10105.

"Graphene", Scientific Background on the Nobel Prize in Physics 2010, compiled by the Class for Physics of the Royal Swedish Academy of Sciences.

Yong Seung Kim, Direct Integration of Polycrystalline Graphene into Light Emitting Diodes by Plasma-Assisted Metal-Catalyst-Free Synthesis, ACS nano, vol. 8, No. 3, 2230-2236, 2014.

Extended European Search Report dated Jul. 31, 2019, issued in corresponding European Patent Application No. 18212973.4.

Exteneled European Search report dated Aug. 7, 2019, issued in corresponding European Patent Appication No. 18206535.9.

Y. Wang et al., 'Toward Hight Throughput Interconvertible Graphene-to-Graphene Growth and Patterning', ACS Nano, vol. 4, No. 10, 2010, pp. 6146-6152.

Z. Luo et al., 'Thickness-Dependent Reversible Hydrogenation of Graphene Layers'. ACS Nano, vol. 3, No. 7, 2000, pp. 1781-1788.

L. Pedrazzetti et al., 'Growth and characterization of ullrathin carbon films on eectrodeposited Cu and Ni'. *Surface and Interface Analysis*, vol. 49, 2017, pp. 1068-1094.

Extended European Search report dated Dec. 20, 2019, issued in corresponding European Patent Application No. 19171635.6.

Office Action from the Korean Patent Office dated Jun. 11, 2018 for KR Appl. No. 10-2017-0161833.

Office Action dated Jul. 10, 2020, received in corresponding U.S. Appl. No. 16/884,590.

Office Action dated Jun. 11, 2020, received in corresponding U.S. Appl. No. 16/183,146.

Richard J. Lewis, Sr., editor; Hawley's Condensed Chemical Dictionary; 12th edition; Van Nostrand Reinhold Company, New York; 1993; pp. 3, 25, 254, and 994-995.

Office Action dated Jul. 17, 2020, received in corresponding U.S. Appl. No. 16/244,906.

* cited by examiner

INTERCONNECT STRUCTURE HAVING NANOCRYSTALLINE GRAPHENE CAP LAYER AND ELECTRONIC DEVICE INCLUDING THE INTERCONNECT STRUCTURE

CROSS-REFERENCE TO RELATED APPLICATION

This application claims the benefit of Korean Patent Application No. 10-2018-0086013, filed on Jul. 24, 2018, in the Korean Intellectual Property Office, the disclosure of which is incorporated herein in its entirety by reference.

BACKGROUND

1. Field

The present disclosure relates to an interconnect structure, and more particularly, to an interconnect structure including a cap layer made of nanocrystalline graphene and/or an electronic device including the interconnect structure.

2. Description of Related Art

In recent years, the size of semiconductor devices is gradually decreasing for the high integration of semiconductor devices and the line width of copper wiring in an interconnect structure is reducing. Meanwhile, when the line width of the copper wiring is reduced, current density in the copper wiring is increased, and as a result, resistance of the copper wiring increases. The increase in the resistance of the copper wiring may cause electromigration of copper atoms, resulting in defects in the copper wiring. Therefore, in order to lower the resistance of the copper wiring and limit and/or prevent the electromigration, a cap layer capable of improving electromigration resistance in the copper wiring may be needed.

SUMMARY

Provided are an interconnect structure including a cap layer made of nanocrystalline graphene and an electronic device including the interconnect structure.

Additional aspects will be set forth in part in the description which follows and, in part, will be apparent from the description, or may be learned by practice of the presented embodiments.

According to an aspect of an embodiment, an interconnect structure includes a dielectric layer provided including at least one trench, a conductive wiring filling an inside of the at least one trench, and a cap layer on at least one surface of the conductive wiring. The cap layer may include nanocrystalline graphene. The nanocrystalline graphene may include nano-sized crystals.

In some example embodiments, the nano-sized crystals may have a size of 0.5 nm to 100 nm. A ratio of carbon having $sp^2$ bonding structure to total carbon in the nanocrystalline graphene may be in a range from 50% to 99%.

In some example embodiments, the nanocrystalline graphene may include hydrogen of 1 atomic percent (at %) to 20 at %. Density of the nanocrystalline graphene may be 1.6 g/cc to 2.1 g/cc.

In some example embodiments, the interconnect structure may further include a substrate. The dielectric layer may be on the substrate. The at least one trench in the dielectric layer may include at least one of a first trench or a second trench.

The first trench in the dielectric layer may not reach the substrate. The second trench in the dielectric layer may reach the substrate.

In some example embodiments, the conductive wiring may include at least one a metal, a metal alloy, or a combination thereof.

In some example embodiments, the interconnect structure may further include a barrier layer. The barrier layer may cover the conductive wiring in the at least one trench. The barrier layer may expose an upper surface of the conductive wiring.

In some example embodiments, the cap layer may cover the upper surface of the conductive wiring. The cap layer may cover an upper surface of the barrier layer around the conductive wiring. The cap layer may cover an upper surface of the dielectric layer around the barrier layer.

In some example embodiments, a metal-containing layer may further be between the conductive wiring and the cap layer.

In some example embodiments, cap layer may include a first cap layer and a second cap layer. The first cap layer may cover the upper surface of the conductive wiring. The second cap layer may be between the conductive wiring and the barrier layer.

In some example embodiments, the cap layer may include a first cap layer and a second layer. The first cap layer may cover the upper surface of the conductive wiring. The second cap layer may cover outer surfaces of the barrier layer in the at least one trench.

In some example embodiments, the barrier layer may cover an entire surface of the conductive wiring. The cap layer may further include a first cap layer and a second cap layer. The first cap layer may cover an upper surface of the barrier layer. The second cap layer may cover outer surfaces of the barrier layer in the at least one trench.

According to an aspect of another embodiment, an electronic device includes a substrate and an interconnect structure on the substrate. The interconnect structure may include a dielectric layer, a conductive wiring, and a cap layer. The dielectric layer may include at least one trench. The conductive wiring may fill the inside of the at least one trench. The cap layer may be on at least one surface of the conductive wiring and may include nanocrystalline graphene. The nanocrystalline graphene may include nano-sized crystals.

The interconnect structure may further include a barrier layer. The barrier layer may cover the conductive wiring in the at least one trench.

According to an aspect of another embodiment, an interconnect structure includes a conductive wiring, a barrier layer, and a cap layer. The conductive wiring includes a side surface, a bottom surface, and an upper surface. The barrier layer surrounds the side surface and the bottom surface of the conductive wiring. The cap layer may be on the upper surface of the conductive wiring. The cap layer includes nanocrystalline graphene. The nanocrystalline graphene includes nano-sized crystals.

In some example embodiments, a width of the cap layer may be different than a width of the conductive wiring.

In some example embodiments, a width of the cap layer and a width of the conductive wiring may be equal.

In some example embodiments, the cap layer may surround the side surface of the conductive wiring.

In some example embodiments, a dielectric layer may surround the side surface of the conductive wiring. The barrier layer may be between the side surface of the conductive wiring and the dielectric layer. A thickness of the barrier layer may be less than or equal to a thickness of the dielectric layer.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
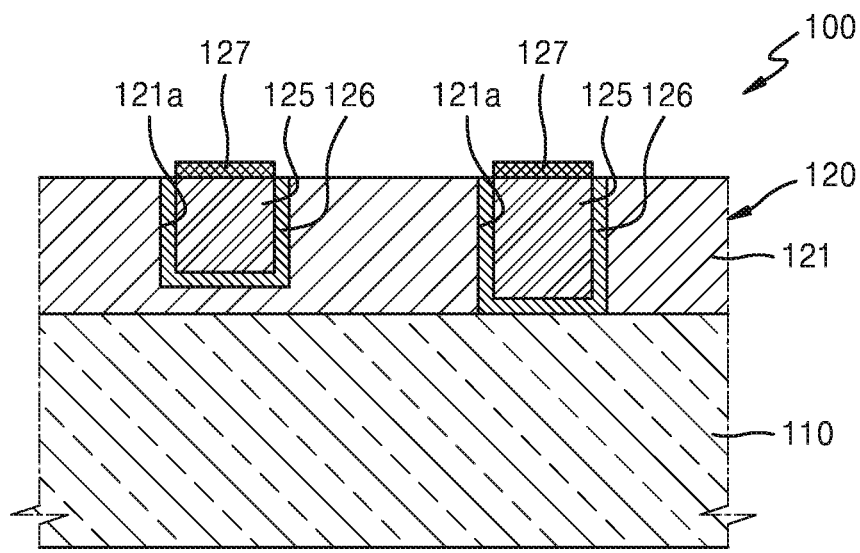
FIG. 1 is a view of an electronic device including an interconnect structure according to an example embodiment.

Reference will now be made in detail to embodiments, examples of which are illustrated in the accompanying drawings. The same reference numerals refer to the same elements throughout. In the drawings, the sizes of constituent elements may be exaggerated for clarity. Furthermore, when an element is referred to as being "on" or "above" another element, it may be directly on the other element, or intervening elements may also be present. Moreover, the materials constituting each layer in the following embodiments are merely examples, and other materials may be used.

FIG. 1 is a view of an electronic device 100 including an interconnect structure 120 according to an example embodiment.

Referring to FIG. 1, the electronic device 100 includes a substrate 110 and the interconnect structure 120 provided on the substrate 110. The interconnect structure 120 may include a dielectric layer 121, a conductive wiring 125, a barrier layer 126, and a cap layer 127.

The substrate 110 may include a semiconductor substrate. For example, the substrate 110 may include a group IV semiconductor material, a group III/V semiconductor compound, or a group II/VI semiconductor compound. As a specific example, the substrate 110 may include silicon (Si), germanium (Ge), silicon carbide (SiC), silicon germanium (SiGe), SiGeC, a Ge alloy, gallium arsenide (GaAs), indium arsenide (InAs), indium phosphide (InP), and the like. However, this is merely an example and various semiconductor materials may be used for the substrate 110.

The substrate 110 may include a single layer or multiple layers in which different materials are stacked. The substrate 110 may include, for example, a silicon-on-insulator (SOI) substrate or a silicon germanium-on-insulator (SGOI) substrate. In addition, the substrate 110 may include a non-doped semiconductor material or a doped semiconductor material.

The substrate 110 may include at least one semiconductor device (not shown). The semiconductor device may include at least one of, for example, a transistor, a capacitor, a diode, and a resistor. However, inventive concepts are not limited thereto.

The dielectric layer 121 is formed on the substrate 110. The dielectric layer 121 may have a single layer structure or a multi-layer structure in which different materials are stacked. The dielectric layer 121 may include a dielectric material used in a typical semiconductor manufacturing process. For example, the dielectric layer 121 may include silicon oxide, nitride, silicon nitride, silicon carbide, silicate, and the like. However, this is merely an example and various dielectric materials may be used as the dielectric layer 121. The dielectric layer 121 may also include an organic dielectric material.

At least one trench 121a may be formed in the dielectric layer 121 to a certain depth. The at least one trench 121a may be formed not to reach the substrate 110 or to reach the substrate 110. Two trenches 121a are formed in the dielectric layer 121 in FIG. 1, wherein one of the trenches 121a is formed not to reach the substrate 110 and the other is formed to reach the substrate 110.

The conductive wiring 125 is provided so as to fill the inside of the trench 121a. The conductive wiring 125 may include a metal or a metal alloy having excellent electrical conductivity. For example, the conductive wiring 125 may include at least one of copper (Cu), ruthenium (Ru), aluminum (Al), cobalt (Co), tungsten (W), molybdenum (Mo), titanium (Ti), tantalum (Ta), nickel (Ni), platinum (Pt), or chromium (Cr), or an alloy thereof, or a combination thereof. However, inventive concepts are not limited thereto, and various metals may be used as the conductive wiring 125.

A barrier layer 126 is provided on an inner wall of the trench 121a. The barrier layer 126 may be provided to cover the conductive wiring 125 between the dielectric layer 121 and the conductive wiring 125. In more detail, the barrier layer 126 may be provided on the inner wall of the trench 121a so as to cover a side surface and a lower surface of the conductive wiring 125. An upper surface of the conductive wiring 125 may be exposed by the barrier layer 126. The barrier layer 126 may limit and/or prevent the diffusion of materials constituting the conductive wiring 125. Meanwhile, the barrier layer 126 may additionally serve as an adhesive layer between the dielectric layer 121 and the conductive wiring 125.

The barrier layer 126 may include a single layer structure or a multi-layer structure in which different materials are stacked. The barrier layer 126 may include, for example, a metal, a metal alloy, or metal nitride. As a specific example, the barrier layer 126 may include Ta, Ti, Ru, RuTa, IrTa, W, titanium nitride (TiN), tantalum nitride (TaN), ruthenium nitride (RuN), IrTaN, or WN. However, this is merely an example and various materials may be used as the barrier layer 126.

The cap layer 127 is provided on the upper surface of the conductive wiring 125 that fills the trench 121a. The cap layer 127 is provided so as to cover the exposed upper surface of the conductive wiring 125. The cap layer 127 may have an edge perpendicular to an edge of the conductive wiring 125.

The cap layer 127 provided on the upper surface of the conductive wiring 125 may include nanocrystalline graphene. The cap layer 127 may have a single layer structure or a multi-layer structure in which a plurality of layers are stacked. The nanocrystalline graphene may include crystals that are smaller in size than intrinsic graphene, which is typical crystalline graphene. For example, the nanocrystalline graphene may include crystals having a nanoscale size, specifically a size of 100 nm or less. When the cap layer 127 made of nanocrystalline graphene is provided on the upper surface of the conductive wiring 125 as described later below, electrical resistance of the conductive wiring 125 may be reduced, thereby improving electromigration resistance.

Hereinafter, intrinsic graphene, nanocrystalline graphene, and an amorphous carbon layer will be specifically described and compared with each other.

Figure 2A:
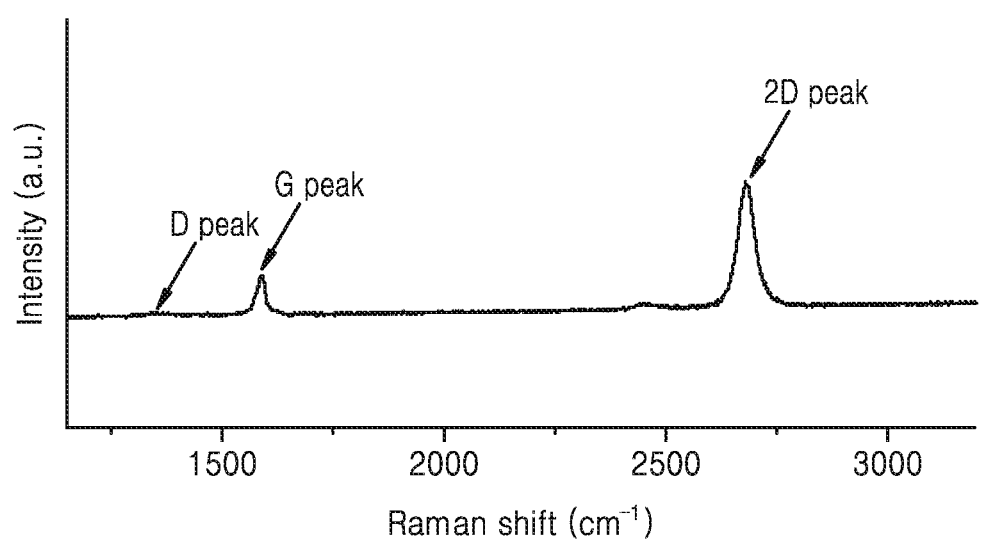
FIG. 2A is an example view of a Raman spectrum representing typical crystalline graphene.
Figure 2B:
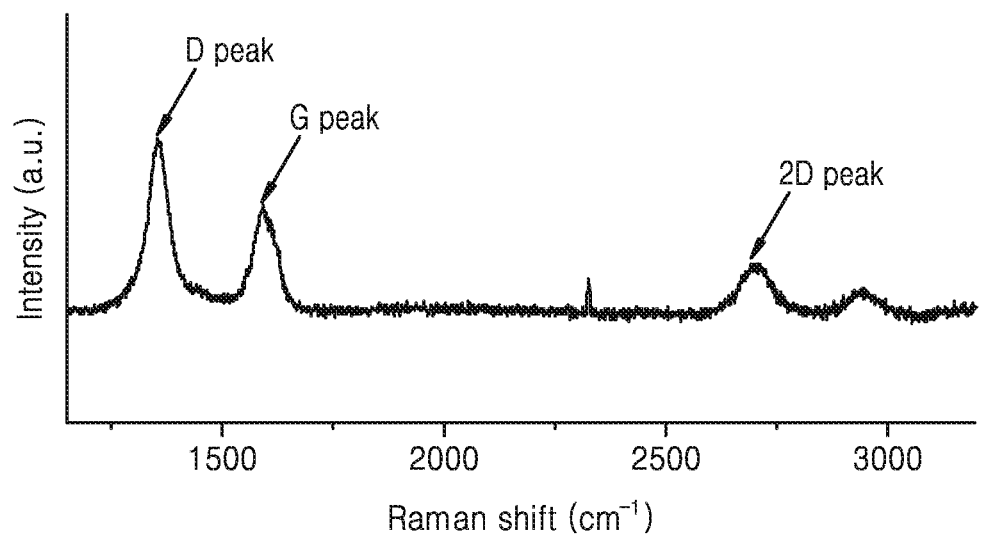
FIG. 2B is an example view of a Raman spectrum representing nanocrystalline graphene according to an example embodiment.
Figure 2C:
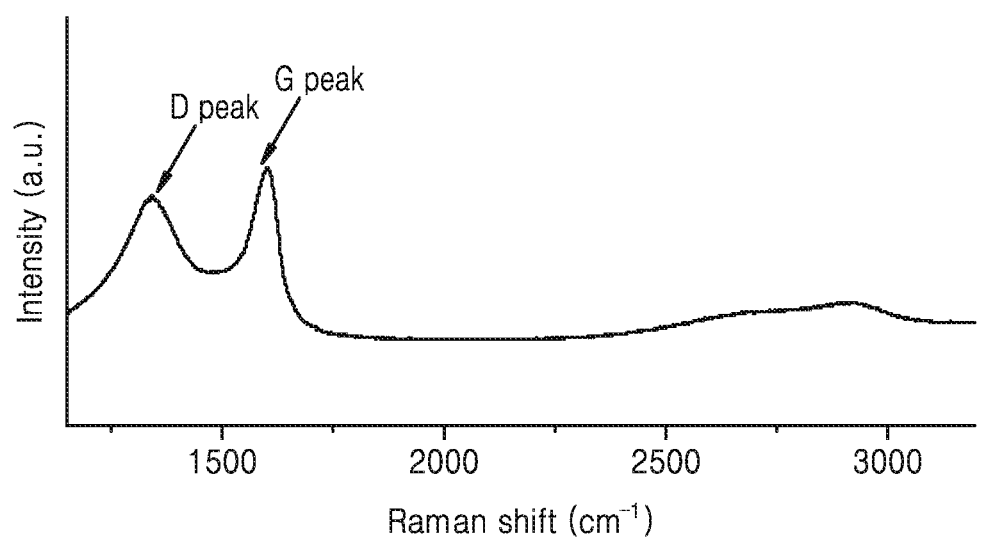
FIG. 2C is an example view of a Raman spectrum representing an amorphous carbon layer.

FIGS. 2A to 2C are example views of Raman spectrums representing typical crystalline graphene, nanocrystalline graphene, and an amorphous carbon layer, respectively. The ratio of carbon having an $sp^2$ bonding structure to total carbon described later below may be obtained, for example, by an X-ray photoelectron spectroscopy (XPS) analysis, and the content of hydrogen may be obtained by composition analysis of Rutherford backscattering spectroscopy.

FIG. 2A is an example view of a Raman spectrum representing intrinsic graphene.

Referring to FIG. 2A, for the intrinsic graphene, which is crystalline graphene, the ratio of D peak intensity to G peak intensity may be, for example, less than about 0.1, and the ratio of 2D peak intensity to the G peak intensity may be, for example, greater than about 2. The intrinsic graphene may include crystals of a size greater than about 100 nm.

In the intrinsic graphene, the ratio of carbon having an $sp^2$ bonding structure to total carbon may be almost 100%. Further, the intrinsic graphene may include very little hydrogen. In addition, density of the intrinsic graphene may be, for example, about 2.1 g/cc, and sheet resistance of the intrinsic graphene may be, for example, about 100 to 300 Ohm/sq.

FIG. 2B is an example view of a Raman spectrum representing nanocrystalline graphene.

Referring to FIG. 2B, for the nanocrystalline graphene, the ratio of D peak intensity to G peak intensity may be, for example, less than about 2.1, and the ratio of 2D peak intensity to the G peak intensity may be, for example, greater than about 0.1. A full width at half maximum (FWHM) of a D peak may be, for example, about 25 to 120 cm$^{-1}$.

The nanocrystalline graphene may include crystals that are smaller in size than intrinsic graphene, for example, crystals having a size of about 0.5 nm to 100 nm. In the nanocrystalline graphene, the ratio of carbon having an $sp^2$ bonding structure to total carbon may be, for example, about 50% to about 99%. The nanocrystalline graphene may include, for example, hydrogen of about 1 atomic percent (at %) to about 20 at %. Also, density of the nanocrystalline graphene may be, for example, about 1.6 g/cc to 2.1 g/cc, and sheet resistance of the nanocrystalline graphene may be, for example, greater than about 1000 Ohm/sq.

FIG. 2C is an example view of a Raman spectrum representing an amorphous carbon layer.

Referring to FIG. 2C, in the amorphous carbon layer, an FWHM of a D peak may be, for example, greater than about 120 cm-1. In the amorphous carbon layer, the ratio of carbon having an sp2 bonding structure to total carbon may be, for example, about 30% to about 50%. The amorphous carbon layer may include, for example, hydrogen having a ratio greater than about 20 at %.

In recent years, the size of semiconductor devices is gradually decreasing for the high integration of semiconductor devices. Therefore, the line width of a conductive wiring may be reduced. However, when the line width of the conductive wiring is reduced, current density in the conductive wiring is increased, and as a result, electrical resistance of the conductive wiring increases. Such an increase in the electrical resistance causes electromigration phenomena, so that defects occur in the conductive wiring, thereby damaging the conductive wiring. The electromigration phenomena refer to the movement of a material due to the continuous movement of ions in a conductor caused by the transfer of momentum between conductive electrons and atomic nuclei in a metal.

When the cap layer 127 covering the upper surface of the conductive wiring 125 is made of nanocrystalline graphene, as in the present embodiment, the electrical resistance of the conductive wiring 125 may be reduced. As a specific example, when a cap layer made of Co is provided on the upper surface of a copper wiring, electrical resistance of the copper wiring may be reduced by about 4% compared with a case where the cap layer is not provided on the upper surface of the copper wiring. On the contrary, when a cap layer made of nanocrystalline graphene is provided on the upper surface of a copper wiring, electrical resistance of the copper wiring may be reduced by about 10% compared with a case where the cap layer is not provided on the upper surface of the copper wiring.

As such, the electrical resistance of the conductive wiring 125 may be reduced by providing the cap layer 127 made of nanocrystalline graphene on the upper surface of the conductive wiring 125, and electromigration resistance may be improved. Therefore, it is possible to reduce the occurrence of defects in the conductive wiring 125, thereby limiting and/or preventing the conductive wiring 125 from being damaged.

Figure 3A:
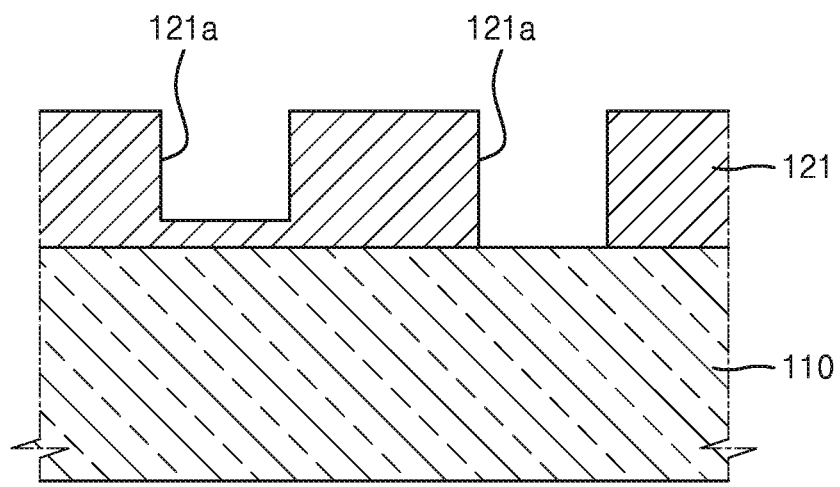
FIGS. 3A to 3C are example views of a method of manufacturing an electronic device including the interconnect structure shown in FIG. 1.
Figure 3B:
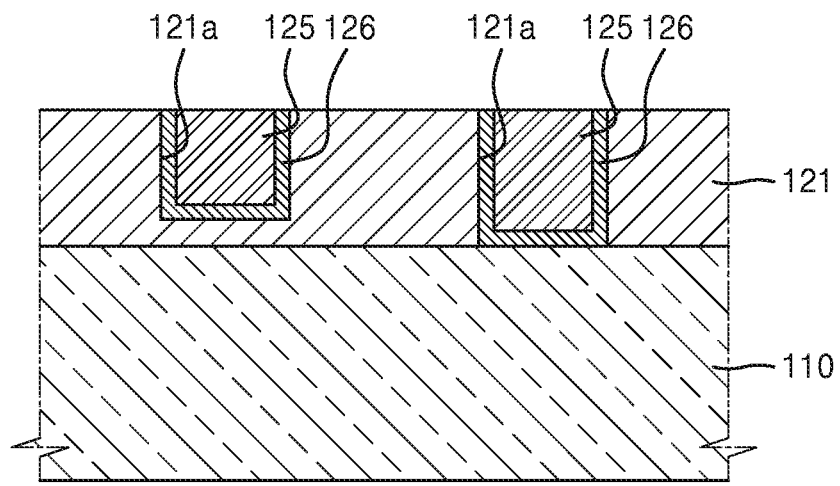
Figure 3C:
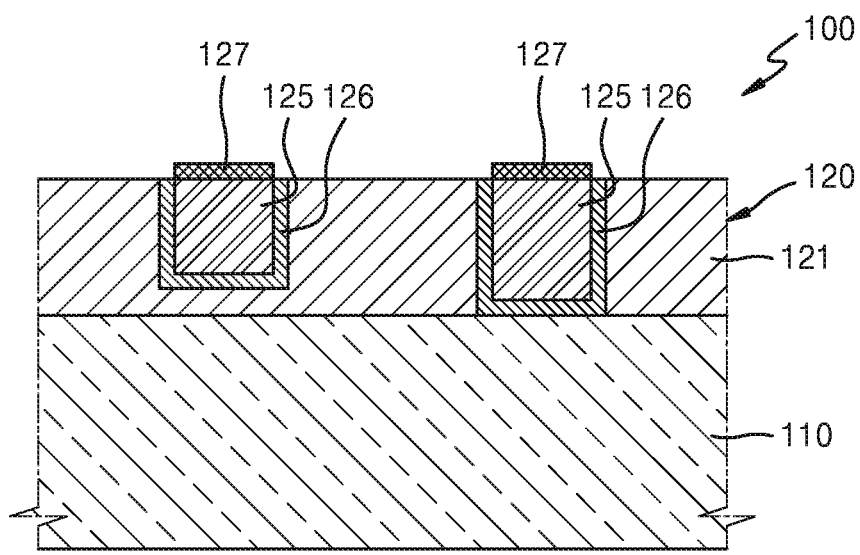

FIGS. 3A to 3C are example views of a method of manufacturing the electronic device 100 including the interconnect structure 120 shown in FIG. 1.

Referring to FIG. 3A, the dielectric layer 121 including at least one trench 121a is formed on the substrate 110. In more detail, first, the dielectric layer 121 is formed on the substrate 110. The dielectric layer 121 may be formed using a deposition process used in a general semiconductor manufacturing process, for example, chemical vapor deposition (CVD), plasma enhanced chemical vapor deposition (PECVD), spin coating, or the like.

The substrate 110 may include a semiconductor substrate. For example, the substrate 110 may include a Group IV semiconductor material, a Group III/V semiconductor compound, or a Group II/VI semiconductor compound. The substrate 110 may include a single layer or multiple layers in which different materials are stacked. Furthermore, the substrate 110 may include, for example, a silicon-on-insulator (SOI) substrate or a silicon germanium-on-insulator (SGOI) substrate. In addition, the substrate 110 may include a non-doped semiconductor material or a doped semiconductor material.

The substrate 110 may include at least one semiconductor device (not shown). For example, the semiconductor device may include at least one of a transistor, a capacitor, a diode, and a resistor, but is not limited thereto.

The dielectric layer 121 may include a dielectric material used in a typical semiconductor manufacturing process. For example, the dielectric layer 121 may include silicon oxide, nitride, silicon nitride, silicon carbide, silicate, and the like. However, this is merely an example and various dielectric materials may be used as the dielectric layer 121. The dielectric layer 121 may also include an organic dielectric material. The dielectric layer 121 may have a single layer structure or a multi-layer structure in which different materials are stacked.

Next, at least one trench 121a is formed in the dielectric layer 121 to a certain depth. The at least one trench 121a may be formed by, for example, a photolithography process and an etching process. The at least one trench 121a may be formed not to reach the substrate 110 or to reach the substrate 110. Two trenches 121a are formed in the dielectric layer 121 in FIG. 3A, wherein one of the trenches 121a is formed not to reach the substrate 110 and the other is formed to reach the substrate 110.

Referring to FIG. 3B, the conductive wiring 125 and the barrier layer 126 are formed in at least one trench 121a of the dielectric layer 121. First, the barrier layer 126 is formed so as to cover a surface of the dielectric layer 121. Here, the barrier layer 126 may be formed by a deposition process used in a general semiconductor manufacturing process. The barrier layer 126 may include, for example, a metal, a metal alloy, or metal nitride. However, inventive concepts are not limited thereto. The barrier layer 126 may include a single layer structure or a multi-layer structure in which different materials are stacked.

Next, the conductive wiring 125 is formed on a surface of the barrier layer 126 so as to fill the inside of the at least one trench 121a. The conductive wiring 125 may be formed by CVD, PECVD, physical vapor deposition (PVD), electroplating, chemical solution deposition, electroless plating, or the like. Meanwhile, when the conductive wiring 125 is formed by electroplating, a plating seed layer (not shown) for promoting electroplating may be formed on the surface of the barrier layer 126 before the conductive wiring 125 is formed. Such a plating seed layer may include, for example, Cu, a Cu alloy, iridium (Ir), Ir alloy, Ru, or a Ru alloy, but this is merely an example.

The conductive wiring 125 may include a metal or a metal alloy having excellent electrical conductivity. For example, the conductive wiring 125 may include Cu, Ru, Al, Co, W, Mo, Ti, Ta, Ni, Pt, Cr, or an alloy thereof. However, inventive concepts are not limited thereto, and various metals may be used as the conductive wiring 125.

Subsequently, as shown in FIG. 3B, the upper surface of the dielectric layer 121, the upper surface of the barrier layer 126, and the upper surface of the conductive wiring 125 are processed to be flush through a planarization process. Here, the planarization process may include, for example, a chemical mechanical polishing (CMP) process or a grinding process, but is not limited thereto.

Referring to FIG. 3C, the cap layer 127 including nanocrystalline graphene is provided on the upper surface of the conductive wiring 125. The cap layer 127 may be formed to cover an exposed upper surface of the conductive wiring 125. Here, the cap layer 127 including nanocrystalline graphene may have a single layer structure or a multi-layer structure.

As described above, the nanocrystalline graphene may include crystals that are smaller in size than intrinsic graphene, which is typical crystalline graphene, for example, crystals having a size of about 100 nm or less, in more detail, crystals having a size of about 0.5 nm to 100 nm. In the nanocrystalline graphene, the ratio of carbon having an $sp^2$ bonding structure to total carbon may be, for example, about 50% to about 99%. The nanocrystalline graphene may include, for example, hydrogen of about 1 at % to about 20 at %. Also, density of the nanocrystalline graphene may be, for example, about 1.6 g/cc to 2.1 g/cc, and sheet resistance of the nanocrystalline graphene may be, for example, greater than about 1000 Ohm/sq.

The cap layer 127 may be formed on the upper surface of the conductive wiring 125 by growing nanocrystalline graphene through a deposition process such as CVD or PECVD. As a specific example, the cap layer 127 may be formed by growing nanocrystalline graphene on the upper surface of the conductive wiring 125 at a relatively low temperature, for example, at a temperature of about 700° C. or less, using PECVD. The cap layer 127 may also be formed by transferring nanocrystalline graphene to the upper surface of the conductive wiring 125 in addition to the deposition process.

Figure 4:
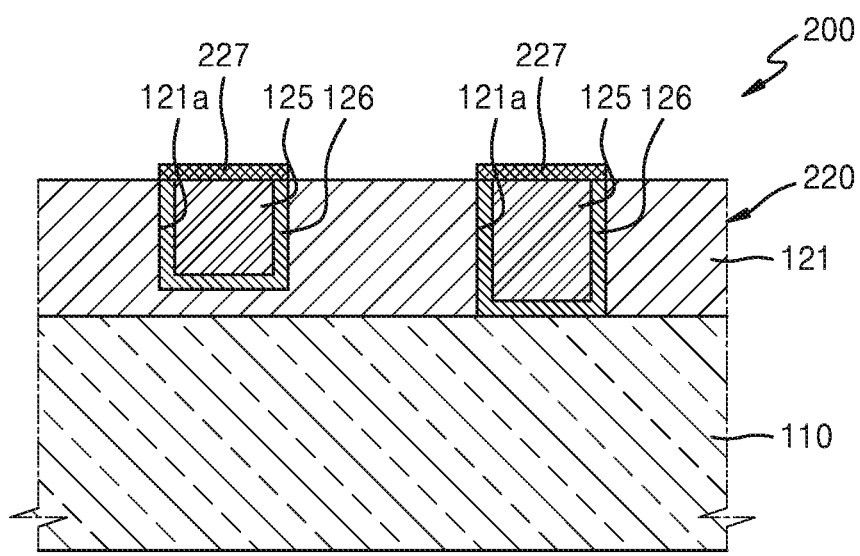
FIG. 4 is a view of an electronic device including an interconnect structure according to another example embodiment.

FIG. 4 is a view of an electronic device 200 including an interconnect structure 220 according to another example embodiment. Hereinafter, different content from the above-described embodiments will be mainly described.

Referring to FIG. 4, the electronic device 200 includes the substrate 110 and the interconnect structure 220 provided on the substrate 110. The interconnect structure 220 may include the dielectric layer 121, the conductive wiring 125, the barrier layer 126, and the cap layer 227.

Since descriptions of the substrate 110 and the dielectric layer 121 are already provided above, repeated descriptions thereof will not be given herein. At least one trench 121a may be formed in the dielectric layer 121 to a certain depth. The conductive wiring 125 is provided so as to fill the inside of the trench 121a. The conductive wiring 125 may include a metal or a metal alloy having excellent electrical conductivity, for example, Cu, Ru, Al, Co, W, Mo, Ti, Ta, Ni, Pt, Cr, or an alloy thereof. However, this is merely an example. The barrier layer 126 is provided on an inner wall of the trench 121a. The barrier layer 126 may be provided to cover the conductive wiring 125 between the dielectric layer 121 and the conductive wiring 125. In more detail, the barrier layer 126 may be provided on the inner wall of the trench 121a so as to cover the side surface and the lower surface of the conductive wiring 125. An upper surface of the conductive wiring 125 may be exposed by the barrier layer 126.

A cap layer 227 is provided on the upper surface of the conductive wiring 125 and an upper surface of the barrier layer 126. In more detail, the cap layer 227 is provided so as to cover the exposed upper surface of the conductive wiring 125 and an exposed upper surface of the barrier layer 126.

The cap layer 227 may include nanocrystalline graphene. As described above, the nanocrystalline graphene may include crystals that are smaller in size than intrinsic graphene, which is typical crystalline graphene, for example, crystals having a size of about 100 nm or less. Since the nanocrystalline graphene has been described in detail in the above-described embodiments, repeated descriptions thereof will not be given herein.

Figure 5:
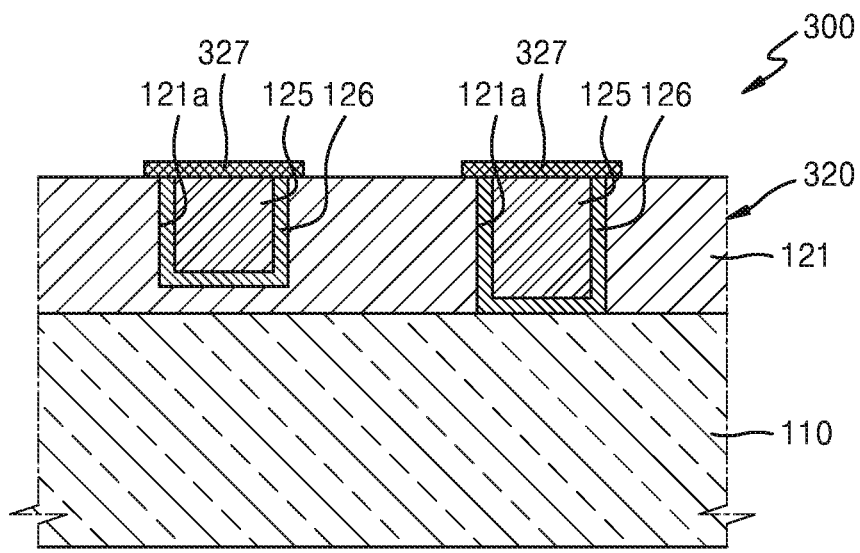
FIG. 5 is a view of an electronic device including an interconnect structure according to another example embodiment.

FIG. 5 is a view of an electronic device 300 including an interconnect structure 320 according to another example embodiment. Hereinafter, different content from the above-described embodiments will be mainly described.

Referring to FIG. 5, the electronic device 300 includes the substrate 110 and the interconnect structure 320 provided on the substrate 110. The interconnect structure 320 may include the dielectric layer 121, the conductive wiring 125, the barrier layer 126, and a cap layer 327.

Since descriptions of the substrate 110 and the dielectric layer 121 are already provided above, repeated descriptions thereof will not be given herein. At least one trench 121a may be formed in the dielectric layer 121 to a certain depth. The conductive wiring 125 is provided so as to fill the inside of the trench 121a. The barrier layer 126 is provided on the inner wall of the trench 121a. In more detail, the barrier layer 126 may be provided on the inner wall of the trench 121a so as to cover the side surface and the lower surface of the conductive wiring 125. An upper surface of the conductive wiring 125 may be exposed by the barrier layer 126.

The cap layer 327 is provided on the upper surface of the conductive wiring 125, the upper surface of the barrier layer 126, and a partial upper surface of the dielectric layer 121. In more detail, the cap layer 227 is provided so as to cover the exposed upper surface of the conductive wiring 125, an exposed upper surface of the barrier layer 126, and an exposed upper surface of the dielectric layer 121 around the barrier layer 126.

The cap layer 327 may include nanocrystalline graphene. As described above, the nanocrystalline graphene may include crystals that are smaller in size than intrinsic graphene, which is typical crystalline graphene, for example, crystals having a size of about 100 nm or less. Since the nanocrystalline graphene has been described in detail in the above-described embodiments, repeated descriptions thereof will not be given herein.

Figure 6:
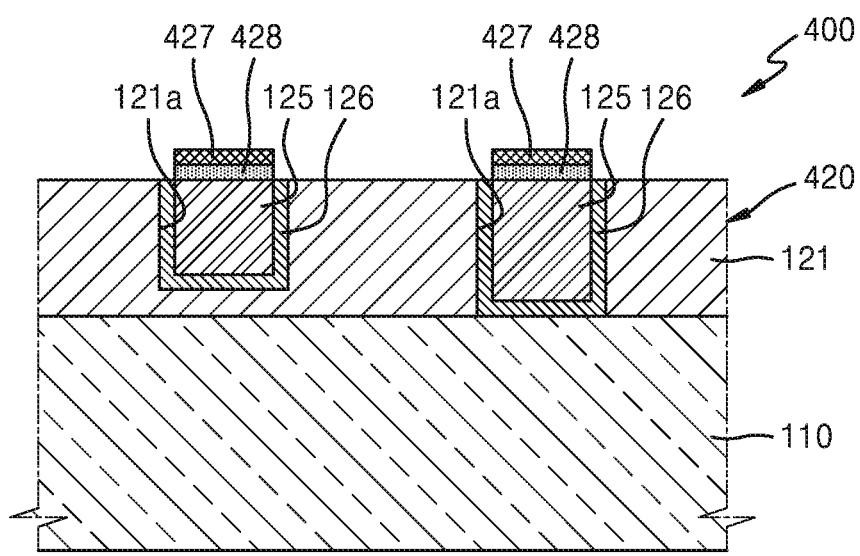
FIG. 6 is a view of an electronic device including an interconnect structure according to another example embodiment.

FIG. 6 is a view of an electronic device 400 including an interconnect structure 420 according to another example embodiment. Hereinafter, different content from the above-described embodiments will be mainly described.

Referring to FIG. 6, the electronic device 400 includes the substrate 110 and the interconnect structure 420 provided on the substrate 110. The interconnect structure 420 may include the dielectric layer 121, the conductive wiring 125, the barrier layer 126, and a cap layer 427.

Since descriptions of the substrate 110 and the dielectric layer 121 are already provided above, repeated descriptions thereof will not be given herein. At least one trench 121a may be formed in the dielectric layer 121 to a certain depth. The conductive wiring 125 is provided so as to fill the inside of the trench 121a. The barrier layer 126 is provided on the inner wall of the trench 121a. In more detail, the barrier layer 126 may be provided on the inner wall of the trench 121a so as to cover the side surface and the lower surface of the conductive wiring 125. An upper surface of the conductive wiring 125 may be exposed by the barrier layer 126.

A metal-containing layer 428 and a cap layer 427 are sequentially formed on the upper surface of the conductive wiring 125. The metal-containing layer 428 may promote growth and formation of nanocrystalline graphene constituting the cap layer 427.

The metal-containing layer 428 may include a metal or a metal alloy having better corrosion resistance or oxidation resistance than a material constituting the conductive wiring 125. For example, the metal-containing layer 428 may include ruthenium (Ru), Ir, platinum (Pt), cobalt (Co), rhodium (Rh), CoW, CoWP, or an alloy thereof. However, this is merely an example. The metal-containing layer 428 may have a single layer structure or a multi-layer structure. The metal-containing layer 428 may be selectively formed on the upper surface of the conductive wiring 125 by, for example, CVD, PECVD, atomic layer deposition (ALD), or the like.

The cap layer 427 is formed on an upper surface of the metal-containing layer 428. The cap layer 427 may include nanocrystalline graphene. As described above, the nanocrystalline graphene may include crystals that are smaller in size than intrinsic graphene, which is typical crystalline graphene, for example, crystals having a size of about 100 nm or less. Since the nanocrystalline graphene has been described in detail in the above-described embodiments, repeated descriptions thereof will not be given herein. As described above, the cap layer 427 may be formed more effectively on the upper surface of the metal-containing layer 428 since the metal-containing layer 428 may promote the growth and formation of the nanocrystalline graphene.

Figure 7:
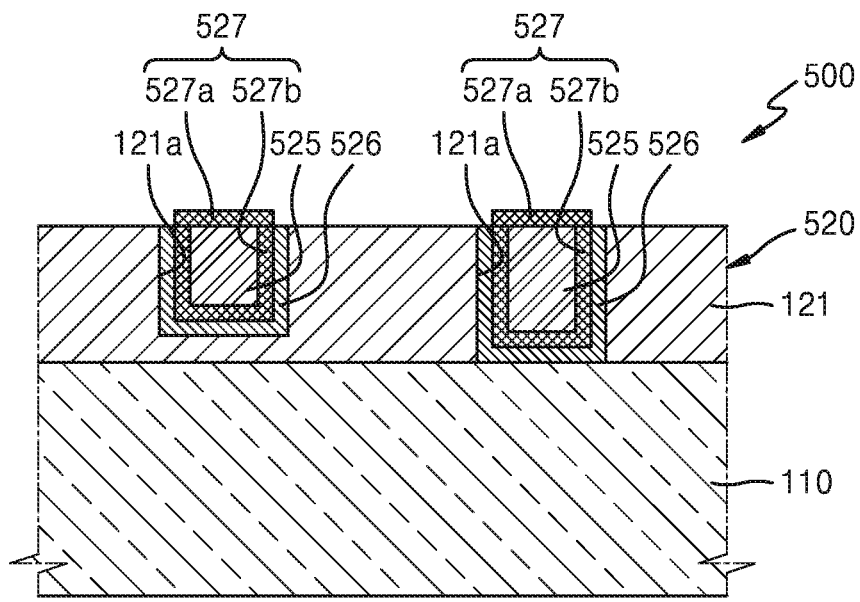
FIG. 7 is a view of an electronic device including an interconnect structure according to another example embodiment.

FIG. 7 is a view of an electronic device 500 including an interconnect structure 520 according to another example embodiment.

Referring to FIG. 7, the electronic device 500 includes the substrate 110 and the interconnect structure 520 provided on the substrate 110. The interconnect structure 520 may include the dielectric layer 121, a conductive wiring 525, a barrier layer 526, and a cap layer 527.

The substrate 110 may include a semiconductor substrate. For example, the substrate 110 may include a Group IV semiconductor material, a Group III/V semiconductor compound, or a Group II/VI semiconductor compound. However, inventive concepts are not limited thereto. The substrate 110 may include a single layer or multiple layers in which different materials are stacked. In addition, the substrate 110 may include a non-doped semiconductor material or a doped semiconductor material. The substrate 110 may include at least one semiconductor device (not shown). For example, the semiconductor device may include at least one of a transistor, a capacitor, a diode, and a resistor, but is not limited thereto.

The dielectric layer 121 is formed on the substrate 110. The dielectric layer 121 may have a single layer structure or a multi-layer structure in which different materials are stacked. The dielectric layer 121 may include a dielectric material used in a typical semiconductor manufacturing process. For example, the dielectric layer 121 may include an inorganic dielectric material or an organic dielectric material.

At least one trench 121a may be formed in the dielectric layer 121 to a certain depth. The at least one trench 121a may be formed not to reach the substrate 110 or to reach the substrate 110. Two trenches 121a are formed in the dielectric layer 121 in FIG. 7, wherein one of the trenches 121a is formed not to reach the substrate 110 and the other is formed to reach the substrate 110.

The conductive wiring 525 is provided so as to fill the inside of the trench 121a. The conductive wiring 525 may include a metal or a metal alloy having excellent electrical conductivity. For example, the conductive wiring 525 may include Cu, Ru, Al, Co, W, Mo, Ti, Ta, Ni, Pt, Cr, or an alloy thereof. However, inventive concepts are not limited thereto, and various metals may be used as the conductive wiring 525. The cap layer 527 is provided so as to cover the entire surface of the conductive wiring 525. The cap layer 527 may include first and second cap layers 527a and 527b. The first cap layer 527a may cover an upper surface of the conductive wiring 525 and an upper surface of the second cap layer 527*b*, and the second cap layer 527*b* may cover outer surfaces, that is, a side surface and a lower surface, of the conductive wiring 525 in the trench 121*a*.

The cap layer 527 may include nanocrystalline graphene. The cap layer 527 may have a single layer structure or a multi-layer structure in which a plurality of layers are stacked. The nanocrystalline graphene may include crystals that are smaller in size than intrinsic graphene, which is typical crystalline graphene, for example, crystals having a size of about 100 nm or less.

As such, the electrical resistance of the conductive wiring 525 may be reduced by providing the cap layer 527 made of nanocrystalline graphene on the entire surface of the conductive wiring 125, and thus electromigration resistance may be improved. In more detail, the first cap layer 527*a* may increase electromigration resistance which may occur on the upper surface of the conductive wiring 525, and the second cap layer 527*b* may be provided inside the trench 121*a* to increase electromigration resistance which may occur in the side surface and the lower surface of the conductive wiring 525. The second cap layer 527*b* may also serve as a diffusion barrier for limiting and/or preventing the diffusion of materials constituting the conductive wiring 525.

The barrier layer 526 is provided to cover the second cap layer 527*b* inside the trench 121*a*. In more detail, the barrier layer 526 may be provided to cover a side surface and a lower surface of the second cap layer 527*b*. The barrier layer 526 may limit and/or prevent the diffusion of materials constituting the conductive wiring 525. The barrier layer 526 may include a single layer structure or a multi-layer structure in which different materials are stacked. The barrier layer 526 may include, for example, a metal, a metal alloy, or metal nitride. As a specific example, the barrier layer 126 may include Ta, Ti, Ru, RuTa, IrTa, W, TaN, TiN, RuN, TuTaN, IrTaN, or WN. However, this is merely an example and various materials may be used as the barrier layer 526.

In the present embodiment, the second cap layer 527*b* capable of serving as a diffusion barrier is provided between the conductive wiring 525 and the barrier layer 526 to reduce the thickness or the number of layers required for the barrier layer 526.

Meanwhile, FIG. 7 shows an example in which the first cap layer 527*a* covers the upper surface of the conductive wiring 525 and the upper surface of the second cap layer 527*b*. However, the first cap layer 527*a* may be formed to cover only the upper surface of the conductive wiring 525. The first cap layer 527*a* may also be formed to cover the upper surface of the conductive wiring 525, the upper surface of the second cap layer 527*b*, and the upper surface of the dielectric layer 121 around the second cap layer 527*b*.

Figure 8:
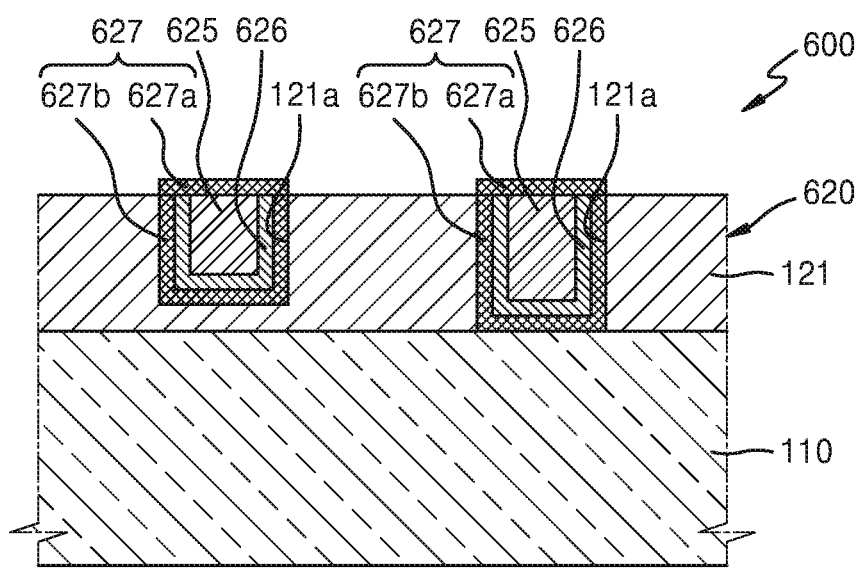
FIG. 8 is a view of an electronic device including an interconnect structure according to another example embodiment.

FIG. 8 is a view of an electronic device 600 including an interconnect structure 620 according to another example embodiment. Hereinafter, different content from the above-described embodiments will be mainly described.

Referring to FIG. 8, the electronic device 600 includes the substrate 110 and the interconnect structure 620 provided on the substrate 110. The interconnect structure 620 may include the dielectric layer 121, a conductive wiring 625, a barrier layer 626, and a cap layer 627.

The substrate 110 may include a semiconductor substrate. The substrate 110 may include a single layer or multiple layers in which different materials are stacked. In addition, the substrate 110 may include a non-doped semiconductor material or a doped semiconductor material. The substrate 110 may include at least one semiconductor device (not shown).

The dielectric layer 121 is formed on the substrate 110. The dielectric layer 121 may have a single layer structure or a multi-layer structure in which different materials are stacked. The dielectric layer 121 may include a dielectric material used in a typical semiconductor manufacturing process. For example, the dielectric layer 121 may include an inorganic dielectric material or an organic dielectric material. At least one trench 121*a* may be formed in the dielectric layer 121 to a certain depth. The at least one trench 121*a* may be formed not to reach the substrate 110 or to reach the substrate 110.

The conductive wiring 625 is provided so as to fill the inside of the trench 121*a*. The conductive wiring 625 may include a metal or a metal alloy having excellent electrical conductivity. For example, the conductive wiring 625 may include Cu, Ru, Al, Co, W, Mo, Ti, Ta, Ni, Pt, Cr, or an alloy thereof. However, this is merely an example.

The barrier layer 626 is provided to cover outer surfaces, that is, a side surface and a lower surface, of the conductive wiring 625 in the trench 121*a*. An upper surface of the conductive wiring 625 may be exposed by the barrier layer 626. The barrier layer 626 may limit and/or prevent the diffusion of materials constituting the conductive wiring 625. The barrier layer 626 may include a single layer structure or a multi-layer structure in which different materials are stacked. The barrier layer 626 may include, for example, a metal, a metal alloy, or metal nitride.

The cap layer 627 is provided so as to cover the conductive wiring 625 and the barrier layer 626. The cap layer 627 may include first and second cap layers 627*a* and 627*b*. The first cap layer 627*a* may cover the upper surface of the conductive wiring 625, an upper surface of the barrier layer 626, and an upper surface of the second cap layer 627*b*, and the second cap layer 627*b* may cover outer surfaces, that is, a side surface and a lower surface, of the barrier layer 626 in the trench 121*a*.

The cap layer 627 may include nanocrystalline graphene. The cap layer 627 may have a single layer structure or a multi-layer structure in which a plurality of layers are stacked. The nanocrystalline graphene may include crystals that are smaller in size than intrinsic graphene, which is typical crystalline graphene, for example, crystals having a size of about 100 nm or less.

The first cap layer 627*a* may increase electromigration resistance which may occur on the upper surface of the conductive wiring 625, and the second cap layer 627*b* may be provided inside the trench 121*a* to increase electromigration resistance which may occur in the side surface and the lower surface of the conductive wiring 625. The second cap layer 627*b* may also serve as a diffusion barrier for limiting and/or preventing the diffusion of materials constituting the conductive wiring 625.

In the present embodiment, the second cap layer 627*b* capable of serving as a barrier is provided on the side surface and the lower surface of the barrier layer 626 to reduce the thickness or the number of layers required for the barrier layer 626.

Meanwhile, FIG. 8 shows an example in which the first cap layer 627*a* covers the upper surface of the conductive wiring 625, the upper surface of the barrier layer 626, and the upper surface of the second cap layer 627*b*. However, the first cap layer 627*a* may also be formed to cover the upper surface of the conductive wiring 625 or to cover the upper surface of the conductive wiring 625 and the upper surface of the barrier layer 626. The first cap layer 627*a* may also be formed to cover the upper surface of the conductive wiring 625, the upper surface of the barrier layer 626, and the upper surface of the dielectric layer 121 around the second cap layer 627b.

Figure 9:
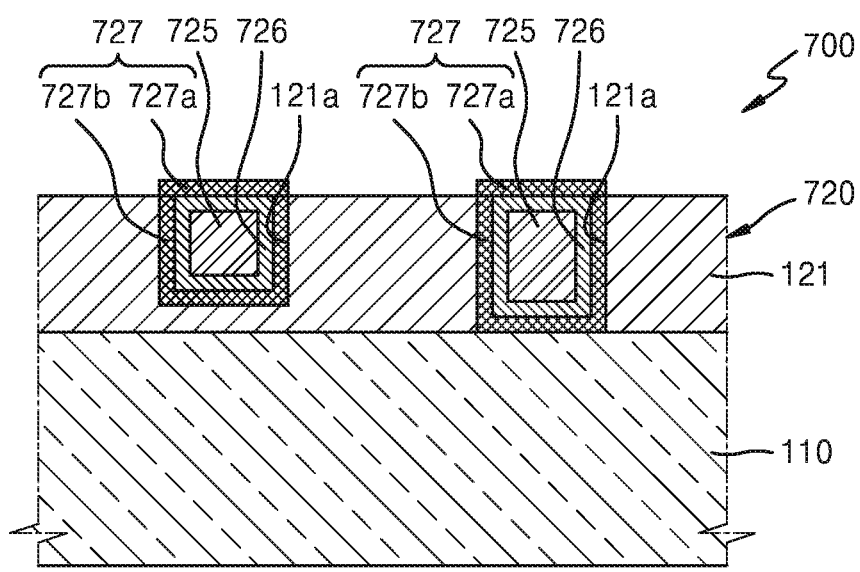
FIG. 9 is a view of an electronic device including an interconnect structure according to another example embodiment.

FIG. 9 is a view of an electronic device including an interconnect structure 720 according to another example embodiment. Hereinafter, different content from the above-described embodiments will be mainly described.

Referring to FIG. 9, the electronic device 700 includes the substrate 110 and the interconnect structure 720 provided on the substrate 110. The interconnect structure 720 may include the dielectric layer 121, a conductive wiring 725, a barrier layer 726, and a cap layer 727.

The substrate 110 is provided with the dielectric layer 121. At least one trench 121a may be formed in the dielectric layer 121 to a certain depth. The at least one trench 121a may be formed not to reach the substrate 110 or to reach the substrate 110.

The conductive wiring 725 is provided so as to fill the inside of the trench 121a. The conductive wiring 725 may include a metal or a metal alloy having excellent electrical conductivity. The barrier layer 726 is provided so as to cover the entire surface (that is, an upper surface, a side surface, and a lower surface) of the conductive wiring 725. The barrier layer 726 may include, for example, a metal, a metal alloy, or metal nitride.

The cap layer 727 is provided so as to cover the barrier layer 726. The cap layer 727 may include first and second cap layers 727a and 727b. The first cap layer 727a may cover an upper surface of the barrier layer 726 and an upper surface of the second cap layer 727b, and the second cap layer 727b may cover outer surfaces, that is, a side surface and a lower surface, of the barrier layer 726 in the trench 121a.

The cap layer 727 may include nanocrystalline graphene. The cap layer 727 may have a single layer structure or a multi-layer structure in which a plurality of layers are stacked. The nanocrystalline graphene may include crystals that are smaller in size than intrinsic graphene, which is typical crystalline graphene, for example, crystals having a size of about 100 nm or less.

The first and second cap layers 727a and 727b may increase electromigration resistance which may occur in the conductive wiring 725. The first and second cap layers 727a and 727b may also serve as a diffusion barrier for limiting and/or preventing the diffusion of materials constituting the conductive wiring 725. Accordingly, the thickness or the number of layers required for the barrier layer 726 may be reduced.

According to the above example embodiments, the electrical resistance of a conductive wiring may be reduced by providing a cap layer including nanocrystalline graphene in the conductive wiring, thereby improving electromigration resistance. As a result, it is possible to reduce the occurrence of defects in the conductive wiring, thereby limiting and/or preventing the conductive wiring from being damaged.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An interconnect structure comprising:
a dielectric layer including at least one trench;
a conductive wiring filling an inside of the at least one trench; and
a cap layer on at least one surface of the conductive wiring, the cap layer including nanocrystalline graphene, the nanocrystalline graphene including nano-sized crystals,
an upper surface of the dielectric layer being level with an upper surface of the conductive wiring, a lower surface of the cap layer, or both the upper surface of the conductive wiring and the lower surface of the cap layer, wherein
a ratio of carbon having an $sp^2$ bonding structure to total carbon in the nanocrystalline graphene is in a range from about 50% to about 99%,
the nanocrystalline graphene comprises hydrogen of 1 at % to 20 at %, and
a density of the nanocrystalline graphene is 1.6 g/cc to 2.1 g/cc.

2. The interconnect structure of claim 1, wherein the nano-sized crystals have a size of about 0.5 nm to about 100 nm.

3. The interconnect structure of claim 1, further comprising:
a substrate, wherein
the dielectric layer is on the substrate.

4. The interconnect structure of claim 3, wherein the at least one trench in the dielectric layer includes at least one of:
a first trench in the dielectric layer that does not reach the substrate, or
a second trench in the dielectric layer that reaches the substrate.

5. The interconnect structure of claim 1, wherein the conductive wiring includes one of a metal, a metal alloy, or a combination thereof.

6. The interconnect structure of claim 1, further comprising:
a barrier layer, wherein
the barrier layer covers the conductive wiring in the at least one trench.

7. The interconnect structure of claim 6, wherein the barrier layer exposes the upper surface of the conductive wiring.

8. The interconnect structure of claim 7, wherein the cap layer covers the upper surface of the conductive wiring.

9. The interconnect structure of claim 8, wherein the cap layer covers the upper surface of the barrier layer around the conductive wiring.

10. The interconnect structure of claim 9, wherein the cap layer covers the upper surface of the dielectric layer around the barrier layer.

11. The interconnect structure of claim 8, further comprising: a metal-containing layer between the conductive wiring and the cap layer.

12. The interconnect structure of claim 8, wherein
the cap layer includes a first cap layer and a second cap layer,
the first cap layer covers the upper surface of the conductive wiring, and
the second cap layer is between the conductive wiring and the barrier layer.

13. The interconnect structure of claim 8, wherein
the cap layer includes a first cap layer and second cap layer,
the first cap layer covers the upper surface of the conductive wiring, and
the second cap layer covers outer surfaces of the barrier layer in the at least one trench.

14. The interconnect structure of claim 6, wherein the barrier layer covers an entire surface of the conductive wiring.

15. The interconnect structure of claim 14, wherein
the cap layer includes a first cap layer and a second cap layer,
a first cap layer covering an upper surface of the barrier layer; and
a second cap layer covering one or more outer surfaces of the barrier layer in the at least one trench.

16. An electronic device comprising:
a substrate; and
an interconnect structure on the substrate,
the interconnect structure including a dielectric layer, a conductive wiring, and a cap layer,
the dielectric layer provided including at least one trench,
the conductive wiring filling an inside of the at least one trench, and
the cap layer on at least one surface of the conductive wiring, the cap layer including nanocrystalline graphene, the nanocrystalline graphene including nano-sized crystals,
an upper surface of the dielectric layer being level with an upper surface of the conductive wiring, a lower surface of the cap layer, or both the upper surface of the conductive wiring and the lower surface of the cap layer, wherein
a ratio of carbon having an $sp^2$ bonding structure to total carbon in the nanocrystalline graphene is in a range from about 50% to about 99%,
the nanocrystalline graphene comprises hydrogen of 1 at % to 20 at %, and
a density of the nanocrystalline graphene is 1.6 g/cc to 2.1 g/cc.

17. The electronic device of claim 16, wherein
the interconnect structure further includes a barrier layer, and
the barrier layer covers the conductive wiring in the at least one trench.

18. An interconnect structure comprising:
a conductive wiring including a side surface, a bottom surface, and an upper surface;
a barrier layer surrounding the side surface and the bottom surface of the conductive wiring;
a cap layer on the upper surface of the conductive wiring, the cap layer including nanocrystalline graphene, the nanocrystalline graphene including nano-sized crystals; and
a dielectric layer surrounding the side surface of the conductive wiring,
an upper surface of the dielectric layer being level with an upper surface of the conductive wiring, a lower surface of the cap layer, or both the upper surface of the conductive wiring and the lower surface of the cap layer, wherein
a ratio of carbon having an $sp^2$ bonding structure to total carbon in the nanocrystalline graphene is in a range from about 50% to about 99%,
the nanocrystalline graphene comprises hydrogen of 1 at % to 20 at %, and
a density of the nanocrystalline graphene is 1.6 g/cc to 2.1 g/cc.

19. The interconnect structure of claim 18, wherein
a width of the cap layer is different than a width of the conductive wiring.

20. The interconnect structure of claim 18, wherein
a width of the cap layer and a width of the conductive wiring are equal.

21. The interconnect structure of claim 18, wherein
the cap layer surrounds the side surface of the conductive wiring.

22. The interconnect structure of claim 18, further comprising:
the barrier layer is between the side surface of the conductive wiring and the dielectric layer, and
a thickness of the barrier layer is less than or equal to a thickness of the dielectric layer.

* * * * *